United States Patent [19]

Urano et al.

[11] Patent Number: 5,215,565
[45] Date of Patent: * Jun. 1, 1993

[54] METHOD FOR MAKING SUPERCONDUCTOR FILAMENTS

[75] Inventors: Akira Urano, Kanagawa; Kenichi Takahashi; Kazuya Ohmatsu, both of Osaka; Masashi Onishi, Kanagawa, all of Japan

[73] Assignee: Sumitomo Electric Industries, Ltd., Osaka, Japan

[*] Notice: The portion of the term of this patent subsequent to Nov. 6, 2007 has been disclaimed.

[21] Appl. No.: 817,965

[22] Filed: Jan. 8, 1992

Related U.S. Application Data

[60] Continuation of Ser. No. 557,012, Jul. 25, 1990, abandoned, which is a division of Ser. No. 181,759, Apr. 14, 1988, Pat. No. 4,968,662.

[30] Foreign Application Priority Data

| Apr. 14, 1987 | [JP] | Japan | 62-91120 |
| Apr. 14, 1987 | [JP] | Japan | 62-91121 |
| Apr. 14, 1987 | [JP] | Japan | 62-91122 |
| May 30, 1987 | [JP] | Japan | 62-137333 |
| Apr. 11, 1988 | [JP] | Japan | 63-088746 |

[51] Int. Cl.$^5$ .................... C03B 37/025; C03C 25/02
[52] U.S. Cl. .......................... 65/3.2; 65/13; 264/211.11; 264/332; 505/704; 505/740
[58] Field of Search .............. 65/3.1, 3.2, 13; 505/1, 505/740, 704; 264/332, 211.11

[56] References Cited

U.S. PATENT DOCUMENTS

| 3,350,186 | 10/1967 | Meinhard | 65/DIG. 11 |
| 3,362,803 | 1/1968 | Dannöhl | 65/3.2 |
| 4,411,959 | 10/1983 | Braginski et al. | 428/558 |
| 4,693,865 | 9/1987 | Goto | 65/3.2 |
| 4,762,754 | 8/1988 | Nellis et al. | 428/552 |
| 4,968,662 | 11/1990 | Urano | 505/740 |
| 5,045,526 | 9/1991 | Nagesh | 505/740 |

FOREIGN PATENT DOCUMENTS

| 0045584 | 2/1982 | European Pat. Off. . |
| 0073128 | 3/1983 | European Pat. Off. . |
| 2613867 | 3/1988 | France . |
| 239333 | 11/1985 | Japan | 65/3.11 |
| 61-227307 | 10/1986 | Japan . |

OTHER PUBLICATIONS

Luhman and Dew-Hughes, "Superconducting Wires of $PbMo_{5.1}S_6$ by a Powder Technique" Feb. 1978, J. Appl. Phys. 49(2) pp. 936-938.

Politis et al. "Superconductivity above 100K in Multi--Phase Y-Ba-Cu-O," Z Phys B-Condensed Matter 66, 279-282, 1987.

Hor et al. "High Pressure Study of the New Y-Ba--Cu-O Superconductive Compound System" Physical Review Letters, vol. 58, No. 9, Mar. 1987 pp. 911-912.

Bednorz et al., "Possible High Tc Superconductivity in the Ba-La-Cu-O System", Zeitschrift Physik B--Condensed Matter, vol. 64, 189-193 (1986).

Politis et al., "Superconductivity above 100K in Multi--Phase Y-Ba-Cu-O", Zeitschrift Fur Physik B--Condensed Matter, vol. 66, 270-282 (1987).

Primary Examiner—Robert L. Lindsay
Attorney, Agent, or Firm—Wegner, Cantor, Mueller & Player

[57] ABSTRACT

A method of the production of the ceramic superconductor filament comprises a step including mixing raw materials of ceramic superconductor, subsequently shaping the mixed ceramic superconductor into a ceramic superconductor body of a predetermined shape and preliminarily sintering thereof and further subsequently crushing the sintered ceramic superconductor body into ceramic superconductor powder;

a step of filling the ceramic superconductor powder in a glass tube;

a step of heating the glass tube including ceramic superconductor powder so that the ceramic superconductor powder is molten; and a step of spinning the glass tube including the ceramic superconductor material whereby a ceramic super conductor covered with the glass material can be obtained.

7 Claims, 5 Drawing Sheets

METHOD FOR MAKING SUPERCONDUCTOR FILAMENTS

This application is a continuation of U.S. Ser. No. 07/557,012 filed Jul. 25, 1990 abandoned, which is a divisional of U.S. Ser. No. 07/181,759 filed Apr. 14, 1988, now U.S. Pat. No. 4,968,662.

BACKGROUND OF THE INVENTION

1. Field of the Invention

The present invention relates to a method of the production of superconductor ceramic filament or filaments.

2. Description of the Prior Art

As the superconductor material, metals, ceramics and organic compositions have been known. Among them, the ceramic superconductor material has become important. Especially, a ceramic oxide superconductor having layer perovskite ($K_2 Ni F_4$) type structure has been known. The oxide ceramic superconductor is produced by mixing oxide powder first followed by pressing and sintering. The ceramic superconductor of the kind mentioned above can show a critical temperature of higher than 30K.

Although the ceramic superconductor can be shaped into blocks or sheets, the ceramic superconductor obtained through the processing mentioned above is fragile and therefore, it is difficult to produce superconductor filaments having good flexibility.

Beside the foregoing, there has been conventionally used such a method of the production of the superconductor filament that superconductor material such as NbTi is inserted in a copper pipe and the copper pipe is subjected to heating or hydraulic pressure so that one or more superconductor filaments can be produced.

However, the conventional method of the production of the superconductor filaments is limited to cases where the superconductor material is provided with a high workability. Therefore, the conventional method can not be applied to the production of the superconductor which is fragile.

The ceramic superconductor material has such an advantage that the critical temperature is relatively high.

In order to make use of the advantage of the ceramic superconductor mentioned above, it has been strongly desired to develop a new method for the production of the ceramic superconductor filaments.

SUMMARY OF THE INVENTION

An essential object of the present invention is to provide a new method for the production of the ceramic superconductor filament.

Another object of the present invention is to provide a method for the production of ceramic superconductor filaments having a high flexibility and high mechanical strength.

In order to accomplish the objects mentioned above, the method of the production of the ceramic superconductor filament or filaments of the present invention essentially comprises:

a step of performing at least one process including mixing raw materials of ceramic superconductor, subsequently shaping the mixed ceramic superconductor into a ceramic superconductor body of a predetermined shape and preliminarily sintering thereof and further subsequently crushing the sintered ceramic superconductor body into ceramic superconductor powder;

a step of filling the ceramic superconductor powder in a glass tube;

a step of heating the glass tube including ceramic superconductor powder so that the ceramic superconductor powder is molten; and a step of spinning the glass tube including the ceramic superconductor material.

According to the invention mentioned above, since there is performed at least one time such a series of processes comprising mixing raw materials of ceramic superconductor, shaping the mixed ceramic superconductor into a ceramic superconductor body of a predetermined shape and preliminarily sintering thereof and further subsequently crushing the sintered ceramic superconductor body into ceramic superconductor powder, even if ceramic superconductor material of high melting point is used there can be obtained composite ceramics or composite oxides of a low melting point by solid reaction with the solid phase. That is to say, in general, the since ceramic superconductor material has a high melting point, it is necessary to sinter the ceramic superconductor material for a long time with a high temperature. In addition even if the ceramic superconductor is sintered for a long time with a high temperature, it can not be assured that the sintered material has a uniform quality with respect to the surface and inside of the ceramic materials. According to the present invention, since the series of the processes are performed at least one time, it is possible to obtain ceramics that have a uniform quality over the inside and outer surfaces of the ceramics.

The ceramic powder made by the processes mentioned above is filled in the glass tube and is heated, whereby the ceramic powder is molten. In addition, by heating the glass tube, the molten ceramic powder, the viscosity of which is low, can be coated by the glass of high viscosity and ductility when molten, whereby the spinning of the ceramic superconductor material can be made easily.

The filament or filaments of the ceramic superconductor material thus obtained by the spinning are covered by the glass, and the mechanical strength and flexibility can be enhanced.

DETAILED DESCRIPTION OF THE PREFERRED EMBODIMENTS OF THE INVENTION

Figure 1:
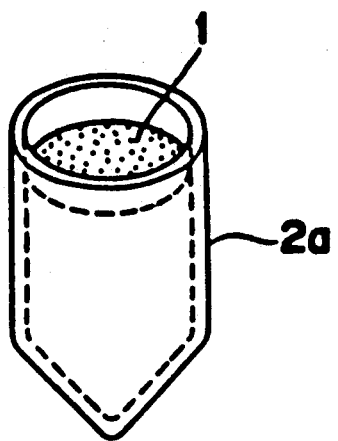
FIG. 1 is a schematic diagram showing an example of glass tube used in the method of the production of the ceramic superconductor filament according to the present invention.

The present invention comprises a step of performing at least one process including mixing raw materials of ceramic superconductor, subsequently shaping the mixed ceramic superconductor into a ceramic superconductor body of a predetermined shape and preliminarily sintering thereof and further subsequently crushing the sintered ceramic superconductor body into ceramic superconductor powder;

filling the ceramic superconductor powder in a glass tube;

heating the glass tube including ceramic superconductor powder so that the ceramic superconductor powder is molten; and spinning the glass tube including the ceramic superconductor material.

As the raw ceramic superconductor material, there may be used various kinds of material so long as the material includes one or more kinds of element which can act as superconductor. However, there may be preferably used material which comprises (1) at least one element selected from the elements of Ia, IIa, IIIa nd Vb groups of the periodic table, (2) at least one element selected from the elements of Ib, IIb, IIIb groups of the periodic table, and (3) at least one element selected from the group consisting of oxygen, boron, carbon, nitrogen, fluorine and sulfur.

Examples of the Ia group elements are Li, Na, K, Rb, Cs and Fr, and examples of the Ib group elements are Cu, Ag and Au.

Examples of the IIa group elements are Be, Mg, Ca, Sr, Ba and Ra, and examples of the IIb group elements are Zn, Cd and the like.

Examples of the IIIa group elements are Sc, Y and lanthanoids lanthanides (e.g. La, Ce, Gd and Lu) and actinides (e.g. Ac Th, Pa and Cf), and examples of IIIb group elements are Al, Ga, In and Tl.

Among the above exemplified elements, those selected from the Ib group elements, the IIa group elements, the IIIa group elements, oxygen are preferred. Among the Ib group elements, Cu and Ag are more preferred, particularly, Cu is most preferred, among the IIa group elements, Sr, Ba and Ca are more preferred and among the IIIa group elements, Sc, Y and La are more preferred.

As the raw material, one or more kinds of materials mentioned above are used in the powder state. As the powder material, there may be used compound of the various constituents mentioned above, such an oxide substance, a carbonated substance, a fluorinated substance, a hydrosulphide substance, a carbide substance and nitride a substance containing the above constituent mentioned above. Among the compounds mentioned above, oxygen including substances such as the oxide substance and carbonated substance are more preferred and oxide substance is most preferred. In order to obtain the ceramic superconductor material of the high critical point, it is preferred that the substance mentioned above contains CuO.

In order to obtain the composite oxide substance of the low melting point using the raw material, the raw materials are mixed at a predetermined rate and thereafter shaped and preliminarily sintered. Furthermore, the sintered material is crushed to piece.

The preliminary sintering may be performed under various kinds of atmosphere, in order to prevent reduction and decomposition of the substance for obtaining the oxide composition of uniform quality. Preferably the preliminary sintering may be performed under presence of suitable amount of oxygen for example, under an atmosphere containing oxygen gas of partial pressure of 150 to 760 mmHg. Other conditions such as the time and temperature of the preliminarily sintering may be selected as desired corresponding to the kind of the raw material to be used.

There can be obtained the oxide composition of uniform structure with a low melting point through the process mentioned above. In case of the production of the ceramics of $Y_{0.3} Ba Cu_{0.7} O_3$ using the raw material of $Y_2 O_3$, $Ba CO_3$ and $Cu O$, which is the high melting point material of 1200° to 2700° C., that is hard to melt, therefore it is necessary to sinter the raw material for a long time with a high temperature. Since the melting points of the respective raw materials are widely different, it is necessary to set the preliminary sintering condition corresponding to the raw material having the highest melting point. Even though the preliminary sintering is performed under a suitable condition, it is difficult to obtain the ceramics having the uniform quality. However, by performing the series of the processes of mixing, shaping, preliminary sintering and crushing, the oxide composition of the low melting point can be obtained by the solid phase reaction in the preliminary sintering process. That is, the oxide composition obtained through the series of the processes has the melting point of 900° to 1400° C. which is lower than the melting points of the respective raw materials with a narrow meltable temperature range. Thus it is possible to obtain the ceramic powder of the uniform quality with the low melting point.

The series of the processes may be performed at least one time.

It is possible to monitor whether or not the desired oxide composition has been produced by way of an X-ray diffraction method. Therefore, the number of repetition of the series of the processes is decided by monitoring the state of the production of the oxide composition.

The crushing into powder can be performed by means of a bowl mill or the like.

The ceramic powder obtained by the above mentioned processes has preferably the structure defined by the following equation (1).

$$A_a B_b C_c \quad (1)$$

wherein A denotes at least one kind of the element selected from the Ia group, IIa group, IIIa group and Vb group of the periodic table, B denotes at least one kind of the element selected from the Ib group, IIb group and IIIb group of the periodic table, and C denotes at least one kind of element selected from a group consisting of oxygen, fulorine, nitrogen, carbon and sulfur.

There may be preferably used the ceramic powder selected from $$Y_{0.3} Ba Cu_{0.7} O_3$$

$$[La Ba]_2 Cu O_4$$

$$[La Sr]_2 Cu O_4 \text{ and}$$

$$[La Ca]_2 Cu O_4.$$

As an example of the material using Vb group, the composition of $Bi_1 Sr_1 Ca_1 Cu_2 O$ may be used.

The ceramic powder are filled in a glass tube and the glass tube and the ceramic powder are heated and brought into a molten state. In addition the glass tube is heated further for spinning.

Specifically, as shown in FIG. 1, the ceramic powder 1 is filled in the glass tube 2 having one end of the tube 2 closed. The glass tube 2 containing the ceramic powder 1 is disposed in a heating and melting device 4 comprising a heater 3. The glass tube 2 with the ceramic powder 1 is heated by the heater 3.

In order to avoid contamination of the ceramic powder by the reaction of the ceramic powder 1 and glass tube 2, the ceramic powder is heated by the heater 5 with oxygen gas supplied to the heating and melting device 4 through the feeding pipe 10. Since the ceramic powder 1 has a low melting temperature, the ceramic powder can be melted with a temperature lower than the melting point of the glass tube 2. After the ceramic powder 1 is molten, the molten ceramic substance is spun by drawing the glass tube through an opening 11 defined at the end portion of the conical part of the heat and melting device 4 so as to obtain a ceramic superconductor filament 8 in which the ceramic superconductor substance 6 is covered by a glass sheath 7. Since the filament is spun in such a manner that the ceramic superconductor substance 6 with low viscosity is covered by the glass sheath 7 of a high viscosity and large expansion factor, the ceramic superconductor filament of uniform quality can be easily manufactured.

As the glass material for the glass tube 2, there may used various kinds of glass having various softening points, optical properties and electrical properties such as soda lime glass, borosilicate glass and aluminosilicate glass because the ceramic superconductor substance 6 is covered by the glass 7 having a high viscosity. However, in order to prevent the ceramic superconductor substance 6 being contaminated by the glass 7 due to mixture of the ceramic superconductor substance 6 and glass 7, as the glass material, there may be preferably glass of which the melting point is higher than that of the ceramic superconductor substance powder 1, such as quartz glass.

The filling process for filling the ceramic superconductor powder 1 in the glass tube 2 and the heating and spinning process may be performed under various atmospheres, preferably the processes are performed under an oxygen containing atmosphere such as ambient condition or the like for preventing the reaction between the ceramic superconductor 1 and glass tube 2. In the heating process and spinning process, the amount of oxygen is sufficient if the reaction between the ceramic superconductor substance and glass is prevented. Thus it is preferable to perform heating and spinning process supplying mixed gas containing oxygen gas of which partial pressure is higher than the partial pressure of the oxygen gas of atmosphereric air. For example, the partial pressure of the oxygen gas of the mixed gas to be supplied may be 200 to 760 mm Hg.

The ratio of the ceramic superconductor substance 8 and glass 7 may be selected corresponding to the mechanical strength of the ceramic superconductor.

As the heaters 3 for heating and melting the ceramic powder 1 and heater 5, there may be used an induction heater or heaters or a resistance heater or heaters as desired.

The diameter of the ceramic superconductor filament 8 may be controlled by adjusting the drawing force and speed of the filament 8 at the spinning process. The shape of the cross section of the filament 8 may be selected as desired such as round shape or rectangular shape by selecting the shape of the opening 11 of the heating and melting device 4.

The ceramic superconductor filament 8 manufactured by the processes as mentioned above has a high mechanical strength and shows superior bending property and flexibility since the ceramic superconductor 6 is covered by the glass tube. Although it has been considered that the workability of the ceramic superconductor body is inferior and its application field has been limited narrow even though the ceramic superconductor body has a high critical temperature, the present invention makes it possible to manufacture the superconductor filaments using the ceramic superconductor body.

The method of the production of ceramic superconductor filaments according to the present invention can be applied to the production processes of magnetic flux sensors and superconductor electric wires which can be used in various kinds of field such as an electronic field and electric application field since the ceramic superconductor has a high critical temperature and high mechanical strength and good bending property.

In another aspect of the present invention (referred to as a second invention hereinafter), the ceramic superconductor powder obtained after the crushing process as performed in the production process mentioned above is filled in a glass tube and is subjected to a local heating whereby the ceramic superconductor is spun so that a ceramic superconductor filament covered by the glass tube can be obtained.

In a further aspect of the present invention (referred to as a third invention), a plurality of ceramic superconductor filaments obtained through the production processes mentioned above are bundled and the bundle of the ceramic superconductor filaments as strands of a multiple conductor filament is again subjected to a further heating and melting processes and further subjected to a further spinning process.

The details of the third invention will be explained hereinafter.

Figure 5:
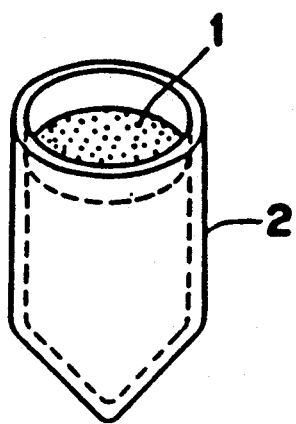
FIG. 5 is a schematic diagram showing an example of glass tube used in the method of the production of the ceramic superconductor filament according to the present invention.

As shown in FIG. 5, the ceramic powder 1 is filled in the glass tube 2a having one end of the tube 2a closed.

Figure 6:
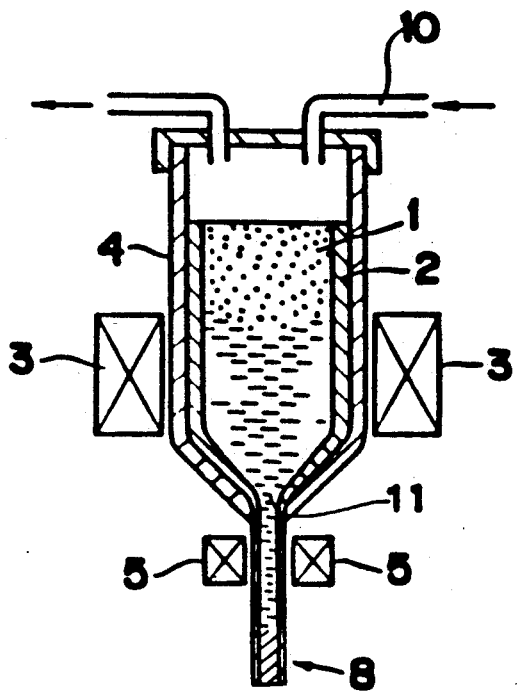
FIG. 6 is a schematic diagram showing an example of a heating and melting device used in the method of the production of the ceramic superconductor filament according to the present invention.
Figure 7:
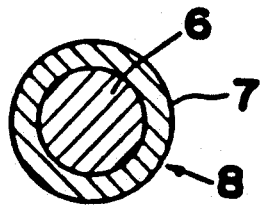
FIG. 7 is a cross sectional view showing a ceramic superconductor filament spun by the device shown in FIG. 6.
Figure 8:
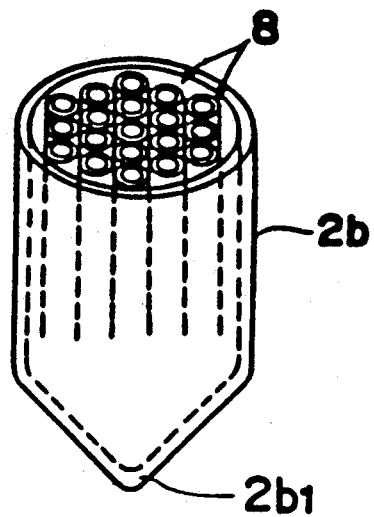
FIG. 8 is a schematic diagram showing an example of glass tube used in the method of the production of the ceramic superconductor filament according to the present invention.
Figure 9:
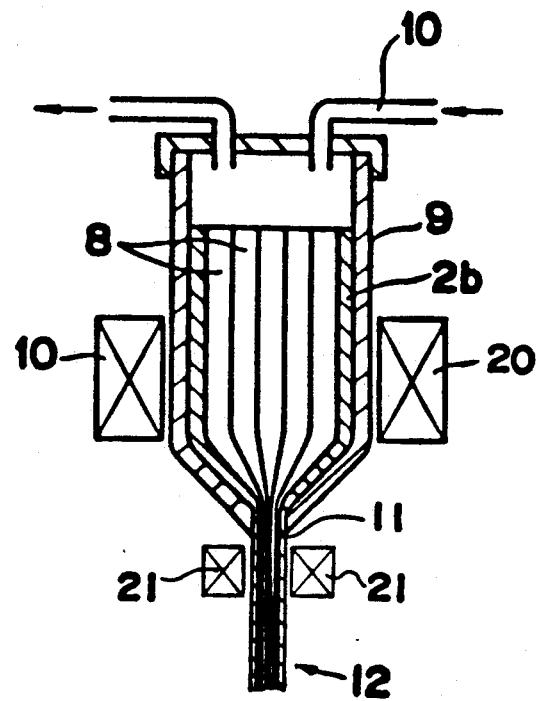
FIG. 9 is a schematic diagram showing an example of a heating and melting device used in the method of the production of the ceramic superconductor filament according to the present invention.
Figure 10:
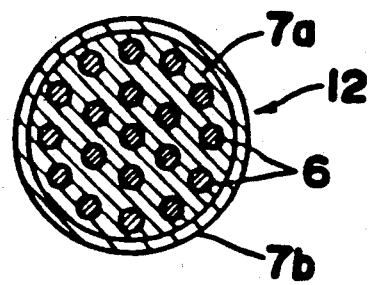
FIG. 10 is a cross sectional view showing a ceramic superconductor filament spun by the device shown in FIG. 9.

The glass tube 2a containing the ceramic powder 1 is disposed in a heating and melting device 4 comprising a heater 3 as shown in FIG. 6. The glass tube 1 with the ceramic powder 2a is heated by the heater 3.

In order to avoid contamination of the ceramic powder by the reaction of the ceramic powder 1 and glass tube 2a, the ceramic powder is heated by the heater 5 with oxygen gas supplied to the heating and melting device 4 through the feeding pipe 10. Since the ceramic powder 1 has a low melting temperature, the ceramic powder can be molten with a temperature lower than the melting point of the glass tube 2a. After the ceramic powder 1 is molten, the molten ceramic substance is spun by drawing the glass tube through an opening 11 defined at the end portion of the conical part of the heat and melting device 4 so as to obtain a ceramic superconductor filament 8 in which the ceramic superconductor substance 6 is covered by a glass sheath 7a. Since the filament is spun in such a manner that the ceramic superconductor substance 6 with low viscosity is covered by the glass sheath 7a of a high viscosity and large expansion factor, the ceramic superconductor filament of uniform quality can be easily manufactured.

A plurality of ceramic superconductor filaments 8 obtained by the process mentioned above are bundled and accommodated in a glass tube 2b in such a manner that each filament 8 is aligned in a direction of the cylindrical axis of the glass tube 2b and the glass tube 2b is accommodated in a heating and melting device 9 in such a manner that the conical head 2b1 of the glass tube 2b is positioned near the opening 11 of the heating and melting device 9.

The heating and melting device 9 is heated by a heater 20 provided around the outer cylindrical surface of the heating and melting device 9. In addition, the glass tube 2b is drawn and spun from the opening 11 of the heating and melting device 9 with the heat of the heater 21 so as to obtain a ceramic superconductor filament 12 made of a bundle of the strands of the ceramic superconductor filaments 6 surrounded and insulated by the filler glass 7a and the bundle of the thin ceramic superconductor filaments are covered by a glass sheath 7b.

The same material, properties and conditions defined for the glass tube 2 in the first invention can be applied to the glass tubes 2a and 2b.

The diameter of the ceramic superconductor filament 12 may be controlled by adjusting the drawing force and speed of the filament 12 at the spinning process. the shape of the cross section of the filament 12 may be selected as desired such as round shape or rectangular shape by selecting the shape of the opening 11 of the heating and melting device 9.

The ceramic superconductor filament 12 manufactured by the processes as mentioned above has a high mechanical strength and shows superior bending property and flexibility since the ceramic superconductor 7 is covered by the filler glass 7a and glass sheath 7b.

It is noted that in the third invention, the glass sheath 7b may be omitted.

In a further aspect of the present invention (referred to as a fourth invention hereinafter), ceramic superconductor particles are filled in a glass tube, which is heated at a predetermined temperature such as 1500° C. to 2500° C. and is spun so as to provide ceramic superconductor filaments each coated by the glass. The ceramic superconductor filaments coated by the glass are subsequently bundled and accommodated in a further glass tube, which is heated at a predetermined temperature such as 1500° C. to 2500° C. so as to spin a further ceramic superconductor filament in which a plurality of the ceramic superconductor filaments are bundled in a matrix shape separated by glass layers. Subsequently the glass layers are removed by chemical agents.

In bundling the ceramic superconductor filaments, there may be mixed a plurality of metal filaments such as Cu or Al filaments coated with glass in the ceramic superconductor filaments and the mixed filaments are subjected to a heating process for melting the glass layers and spinning the bundled filaments containing the ceramic superconductor filaments and metal filaments. Subsequently the glass layers of the bundled filaments are removed by the chemical agents. Subsequently the bundled filaments are subjected to a heating process with such a temperature that is higher than the melting point of the metal filaments but lower than the melting point of the ceramic superconductor, whereby there can be produced a final filament structure in which a plurality of ceramic superconductor filaments are disposed as the strands of a multiple conductor cable in a metal matrix.

In the fourth invention mentioned above, the ceramic superconductor particles are filled in a glass tube of high melting point and the glass tube is heated and spun with a temperature higher than 1500° C., so that the spinning and sintering of the ceramic superconductor substance can be made simultaneously. According to the fourth invention, the work of spinning can be made easy partly because the ceramic superconductor filaments coated with the glass are bundled and it is easy to manufacture a fine ceramic superconductor filament.

The ceramic superconductor filaments with the metal matrix helps to prevent burning of the filaments if the ceramic superconductor material loses the superconductor property.

In addition, the desired cable structure can be maintained as designed because the metal matrix structure can be maintained after the ceramic superconductor filaments arranged into a cable structure.

EXAMPLE 1

Respective predetermined weights of $Y_2O_3$ powder, $BaCO_3$ powder and Cu O powder were mixed. The mixed powder was pressed and shaped under the room temperature in air with 100 atm.. The shaped ceramic superconductor body was preliminarily sintered in an atmosphere of mixed gases of oxygen and nitrogen with the oxygen partial pressure 200 mm Hg and 940° C. for 24 hours. The preliminarily sintered ceramic superconductor body was crushed into powder by a bowl mill. The above mentioned processes were repeated until composite oxide substance $Y_{0.3}$ Ba $Cu_{0.7}$ $O_3$ was monitored by an X ray diffraction.

Figure 2:
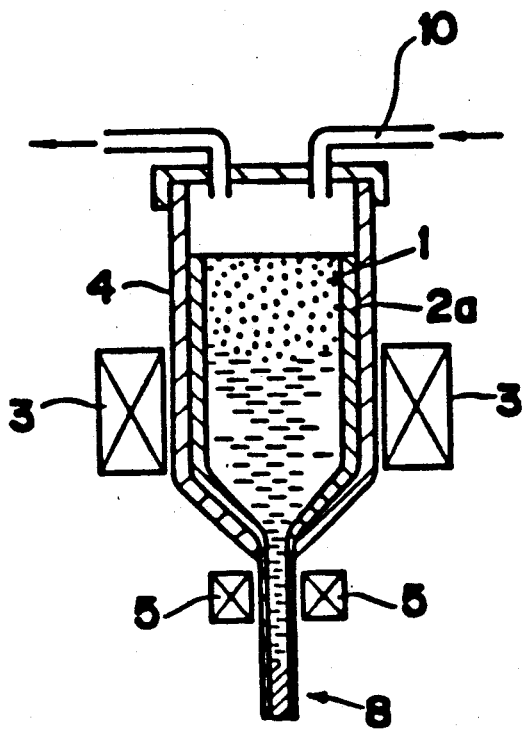
FIG. 2 is a schematic diagram showing an example of a heating and melting device used in the method of the production of the ceramic superconductor filament according to the present invention.
Figure 3:
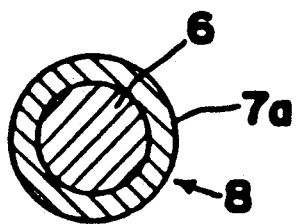
FIG. 3 is a cross sectional view showing a ceramic superconductor filament spun by the device shown in FIG. 2.

The ceramic powder of composite oxide substance was filled and sealed in the quartz glass tube 2. The glass tube 2 was situated in the heating and melting device as shown in FIG. 2. The ceramic superconductor powder was heated and molten at 1300° C. with the oxygen containing gas of oxygen partial pressure 200 mm Hg to 760 mmHg fed. The quartz glass tube was heated at 1700° C. to 2200° C. for spinning the ceramic superconductor material with the glass tube, whereby there was obtained a ceramic superconductor filament covered by the quartz glass tube of outer diameter 200 μm and inner diameter 120 μm.

COMPARATIVE EXAMPLE 1

As a comparative example, the ceramic superconductor powder obtained in the manner mentioned above was shaped into a sheet and the sheet was preliminarily sintered with the same sintering condition as the example 1 to provide a sintered ceramic superconductor sheet.

The critical temperature was measured for the products of the example 1 and the comparative example by measuring the electric resistance of the respective ceramic superconductor filament of the example 1 and comparative example.

Figure 4:
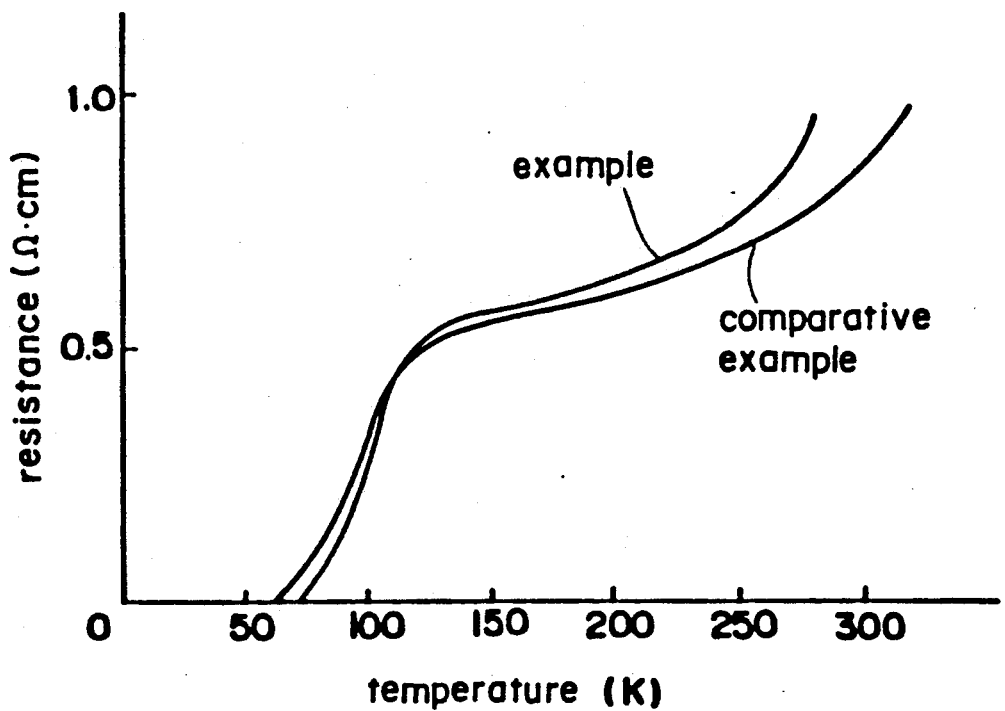
FIG. 4 is graphs showing electric property of the ceramic superconductor filament of the example 1 with a property of the ceramic superconductor sheet of the comparative example.

The result of the measurement is shown in FIG. 4, from which it can be said that the critical temperature of the ceramic superconductor filament of the example 1 is slightly higher than the critical temperature of the ceramic superconductor sheet of the comparative example and the mechanical strength and bending property of the ceramic superconductor filament of the example 1 are higher than those of the ceramic superconductor sheet of the comparative example.

EXAMPLE 2

A ceramic superconductor filament was produced in the same manner as example 1 except that the spinning was performed by heating the limited local portion of the quartz glass tube and obtained a ceramic superconductor filament made of the ceramic superconductor substance covered by the quartz glass tube of an outer diameter 2 mm and inner diameter of 1 mm.

The term local means such a portion that is very near the opening 11 of the heating and melting device 4 but on the side of the thin glass tube 8.

The result of the measurement is similar to those obtained in the example 1 and comparative example as shown in FIG. 4.

EXAMPLE 3

Respective predetermined weights of $Y_2O_3$ powder, $BaCO_3$ powder and Cu O powder were mixed. The mixed powder was pressed and shaped under the room temperature in air with 100 atm. The shaped ceramic superconductor body was preliminarily sintered in an atmosphere of a mixture of oxygen gas and nitrogen gas with the oxygen partial pressure 200 mm Hg and 940° C. for 24 hours. The preliminarily sintered ceramic superconductor body was crushed into powder by a bowl mill. The above mentioned processes were repeated until composite oxide substance $Y_{0.3} Ba Cu_{0.7} O_3$ was monitored by an X ray diffraction.

The ceramic powder of composite oxide substance was filled and sealed in the quartz glass tube 2. The glass tube 2 was situated in the heating and melting device as shown in FIG. 2. The ceramic superconductor powder was heated and molten at 1300° C. with the oxygen containing gas of partial pressure 200 mmHg to 760 mmHg fed. The quartz glass tube was heated at 1700° C. to 2200° C. for spinning the ceramic superconductor material with the glass tube, whereby there was obtained a ceramic superconductor filament covered by the quartz glass tube of outer diameter 200 μm and inner diameter 120 μm. In the same manner mentioned above, a number of the ceramic superconductor filaments were produced.

100 ceramic superconductor filaments were bundled and accommodated in a quartz glass tube. The 100 ceramic superconductor filaments were locally heated with the temperature 1700° C. to 2200° C. and spun, whereby there could be obtained a ceramic superconductor filament of multiple conductor type in which a plurality of ceramic superconductor strands were bundled.

The critical temperature was measured for the products of the example 3 and the comparative example by measuring the electric resistance of the ceramic superconductor filament of the example 3 and comparative example.

Figure 11:
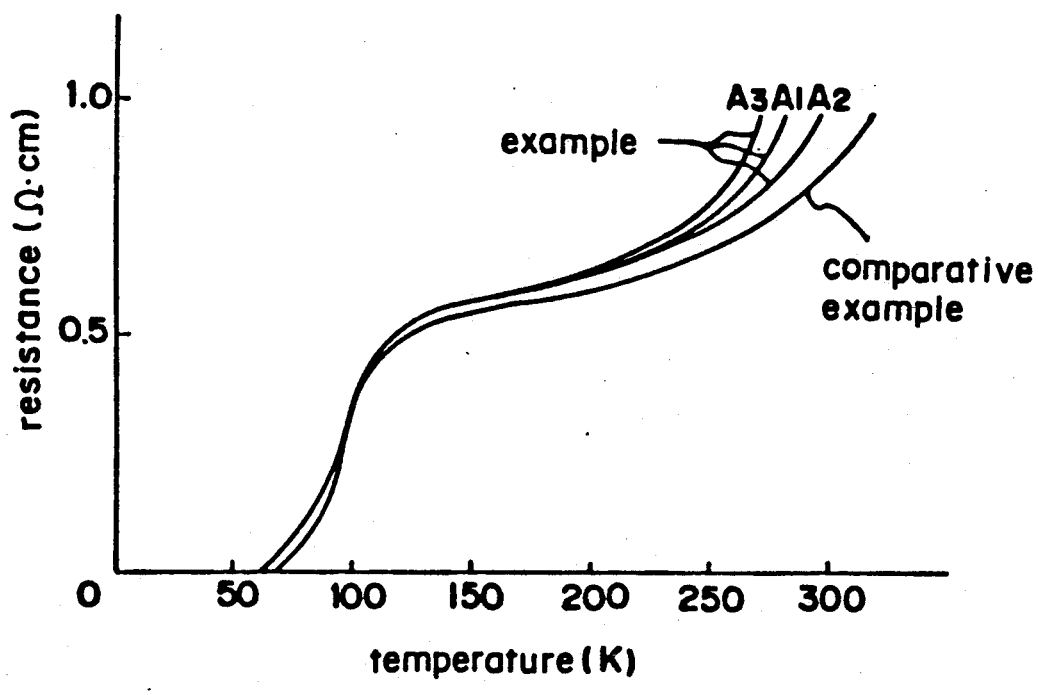
FIG. 11 is graphs showing electric property of the ceramic superconductor filament of the example 3 with a property of the ceramic superconductor sheet of the comparative example.

The result of the measurement is shown in FIG. 11, from which it can be said that the critical temperature of the ceramic superconductor strands A1, A2 and A3 of the example 3 is slightly higher than the critical temperature of the ceramic superconductor sheet of the comparative example and the mechanical strength and bending property of the ceramic superconductor filament of the example 3 are higher than those of the ceramic superconductor sheet of the comparative example.

EXAMPLE 4

Ceramic superconductor particles consisting of oxide substances of respective elements Cu, Ba and Sc were filled in a composite quartz glass tube, which was inserted in a resistance furnace heated at 2,100° C., whereby the ceramic superconductor with the quartz glass tube were spun into a filament of 300 μm outer diameter. 1,000 filaments obtained in the manner mentioned above were accommodated in a quartz tube of 17 mm inner diameter and molten and integrated at 1,800° C., whereby a ceramic superconductor filament of 1 mm outer diameter were spun. Subsequently, the quartz glass was removed by aqueous hydrofluoric acid, whereby there could be obtained a ceramic superconductor filament of 18 mm outer diameter with a uniform quality.

EXAMPLE 5

Ceramic superconductor particles similar to those used in the example 4 were filled in a vycor glass tube of 22 mm outer diameter and 10 mm inner diameter and inserted in a resistance furnace heated at 1,800° C., and then were spun to obtain ceramic superconductor filament of 150 μm. 5,000 filaments spun in the manner mentioned above were bundled with 2,000 copper filaments coated with vycor glass with 600 μm and the bundled filaments were inserted in a vycor glass tube in such a manner that the ceramic superconductor filaments and copper filaments constituted in a matrix shape. The glass layers of the bundled filaments were melted and integrated at 1,800° C., whereby a filament of 1 mm outer diameter was spun. Subsequently, the vycor glass layers were removed by aqueous sodium hydroxide, whereby the copper filaments were melted and integrated under non-active atmosphere at 1,200° C. Thus, there could be obtained a ceramic superconductor filament in which the superconductor strands were disposed in the copper matrix.

The various properties of the ceramic superconductor filaments of the examples 4 and 5 were shown as follows.

| | |
|---|---|
| Critical temperature Tc: | 35K |
| Critical current density Jc: | $10^7$ A/cm$^2$ |

EXAMPLE 6

As the ceramic superconductor material, respective predetermined weights of $Bi_2O_3$ powder, $SrCO_3$ powder, $CaCO_3$ powder and CuO powder were mixed. Subsequently, the mixed powder was pressed and shaped under air atmosphere of normal room temperature with 100 atm. The pressed substance was preliminarily sintered in a gas atmosphere of a mixture of oxygen gas and nitrogen gas (oxygen gas partial pressure of 200 mmHg) with 845° C. for 24 hours. The sintered ceramic body was crushed into powder by a bowl mill. The above process was repeated until $Bi_1Sr_1Ca_1Cu_2O$ was monitored by a X-ray diffraction.

The ceramic powder was filled in a pyrex glass tube i.e., borosilicate glass tube and the pyrex glass tube was situated in a heating and melting device as shown in FIG. 2, whereby the ceramic powder was melted at 1,100° C. while supplying oxygen containing gas of oxygen-partial pressure 200 mmHg to 760 mm Hg. Subsequentially, the pyrex glass tube was locally heated at 1,200° to 1,300° C. and spun. There could be obtained ceramic superconductor filament covered by pyrex glass tube of 2 mm outer diameter and 1 mm inner diameter.

What is claimed is:

1. A method for the production of a ceramic superconductor filament comprising:
    a step of shaping raw materials for a ceramic superconductor material selected from the group consisting of a Y-Ba-Cu-O type superconductor and a Bi-Sr-Ca-Cu-O type superconductor, sintering the shaped material and crushing the shaped material into a powder to produce a sintered ceramic superconductor powder;
    a step of filling the sintered ceramic superconductor powder in a glass tube; and
    a step of heating and melting the ceramic superconductor powder in the glass tube while feeding gaseous oxygen to the glass tube; and
    a step of spinning the heated ceramic superconductor material with the glass tube to thereby produce a ceramic superconductor filament covered by glass.

2. The method according to claim 1, wherein the heating step includes heating a limited portion of the glass tube.

3. A method for the production of a ceramic superconductor filament comprising:
    a step of shaping raw materials for a ceramic superconductor material selected from the group consisting of a Y-Ba-Cu-O type superconductor and a Bi-Sr-Ca-Cu-O type superconductor, sintering the shaped material and crushing the shaped material into a powder to produce a sintered ceramic superconductor powder;
    a step of filling the sintered ceramic superconductor powder in a glass tube;
    a step of heating and melting the ceramic superconductor powder in the glass tube while feeding gaseous oxygen to the glass tube;
    a step of spinning the heated ceramic superconductor material with the glass tube to thereby produce a ceramic superconductor filament covered by glass;
    a step of bundling a plurality of the ceramic superconductor filaments obtained from the first spinning step; and
    a second spinning step of further spinning the bundled ceramic superconductor filaments.

4. A method for the production of a ceramic superconductor filament according to claim 3, wherein the second spinning step provides bundles of filaments covered with a glass layer, the method further comprising a step of removing the glass layer from the ceramic superconductor filament obtained from the second spinning step with a chemical agent.

5. The method according to claim 4, wherein the chemical agent is aqueous hydrofluoric acid or aqueous sodium hydroxide.

6. The method according to claim 1, wherein the ceramic superconductor powder is a substance selected from $Bi\ Sr\ Ca\ Cu_2O$ and $Y_{0.3}\ Ba\ Cu_{0.7}\ O_3$.

7. A method for the production of a ceramic superconductor filament comprising:
    a step of shaping raw materials for a ceramic superconductor material selected from the group consisting of superconductors formed from Y, Ba, Cu and O and superconductors formed from Bi, Sr, Ca, Cu and O, sintering the shaped material and crushing the shaped material into a powder to produce a sintered ceramic superconductor powder;
    a step of filling the sintered ceramic superconductor powder in a glass tube;
    a step of heating and melting the ceramic superconductor powder in the glass tube while feeding gaseous oxygen to the glass tube; and
    a step of spinning the heated ceramic superconductor material with the glass tube to thereby produce a ceramic superconductor filament covered by glass.

* * * * *